United States Patent [19]

Macovski

[11] Patent Number: 4,528,985
[45] Date of Patent: Jul. 16, 1985

[54] BLOOD VESSEL IMAGING SYSTEM USING NUCLEAR MAGNETIC RESONANCE

[76] Inventor: Albert Macovski, 2505 Alpine Rd., Menlo Park, Calif. 94025

[21] Appl. No.: 332,925

[22] Filed: Dec. 21, 1981

[51] Int. Cl.³ .............................................. A61B 5/05
[52] U.S. Cl. ................................... 128/653; 128/691; 324/309
[58] Field of Search ............... 128/653; 324/309–310, 324/312

[56] References Cited

U.S. PATENT DOCUMENTS 3,932,805  1/1976  Abe et al. ............................ 324/309
4,354,499 10/1982  Damadian ....................... 324/309 X

FOREIGN PATENT DOCUMENTS 2854774  7/1980  Fed. Rep. of Germany ...... 128/653

OTHER PUBLICATIONS

Katims, L. M., "NMR Imaging: Methods and Current Status", *Medical Instrumentation*, vol. 16, No. 4, Jul.-Aug. 1982.
Lindberg, D. A. B. et al., "Lecture Notes in Medical Informatics", Springer–Verlog Publ., N.Y. 1981, pp. 78–79, 90–91.

*Primary Examiner*—Kyle L. Howell
*Assistant Examiner*—Francis J. Jaworski
*Attorney, Agent, or Firm*—Flehr, Hohbach, Test, Albritton & Herbert

[57] ABSTRACT

A two-dimensional projection image of the NMR activity within a volume is obtained. The signals due to static material are cancelled and do not appear in the projection image. The signals due to moving blood in vessels produce an isolated image of the vessels with the superimposed structure removed.

19 Claims, 9 Drawing Figures

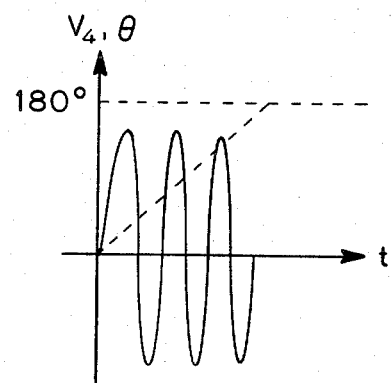
FIG. 4.
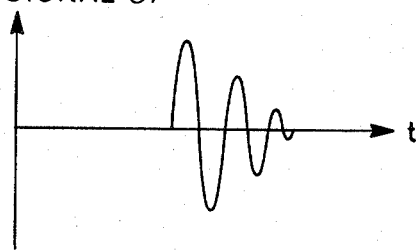
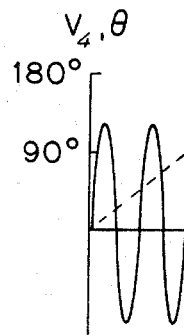
FIG. 5.
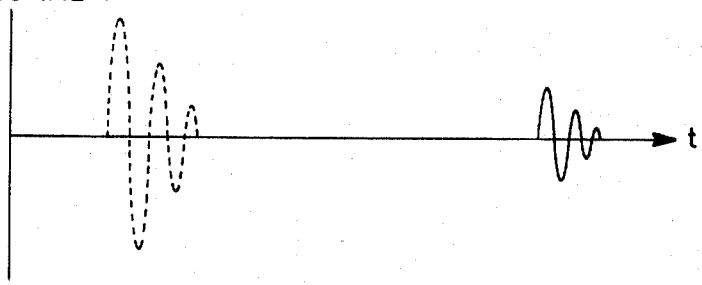

BLOOD VESSEL IMAGING SYSTEM USING NUCLEAR MAGNETIC RESONANCE

BACKGROUND OF THE INVENTION

1. Field of the Invention

This invention relates to medical imaging systems using nuclear magnetic resonance. In a primary application the invention relates to projection imaging of blood vessels by virtue of the moving blood within the vessels. Other applications include general projection imaging of moving materials.

2. Description of Prior Art

Nuclear magnetic resonance, abbreviated NMR, represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pickup coils. By manipulating the magnetic fields, an array of signals are provided representing different regions of the volume. These are combined to produce a volumetric image of the density of the body.

A descriptive series of papers on NMR appeared in the June 1980 issue of the *IEEE Transactions on Nuclear Science*, Vol. NS-27, pp. 1220-1255. The basic concepts are described in the lead article, "Introduction to the Principles of NMR" by W. V. House, pp. 1220-1226.

A number of three-dimensional methods are described. One important one is described by P. V. Lauterbur and C. M. Lou entitled, "Zeugmatography by Reconstruction from Projections," pp. 1227-1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection image. The reconstruction procedure involves the classical reconstruction from projections widely used in current computerized tomography systems. The most generally used procedure is that of convolution-back projection.

The resultant two-dimensional projection images have a number of drawbacks as regards the imaging of vessels. Firstly, the superimposed intervening structures make it very difficult to visualize the vessels and diagnose stenosis or narrowing. Secondly, the nature of this imaging procedure is such that all of the measurements affect every reconstructed pixel. This makes the image particularly sensitive to motion. Any motion of the object will cause artifacts in the image due to inconsistencies where the object does not match its projections. These artifacts can often obscure the desired information.

To avoid the problems of intervening structures, three-dimensional reconstructions are made which provides cross-sectional images. The approach taken in the Lauterbur paper involves making an array of two-dimensional projection images at every angle through the object. Lines in these projection images represent line integrals or projections of cross-sectional planes of the object. Thus, again using classical reconstruction techniques, any desired cross-sectional plane can be reconstructed. The intermediate two-dimensional projections are not used for the reasons discussed.

Although these cross-sectional images are free of intervening structures, they are unsuitable for vessel imaging. Vessel imaging, no matter what the modality, x-ray or NMR, is best done with two-dimensional projection images. Cross-sections merely show slices through the vessels. In addition, the acquisition of three-dimensional data takes a relatively long time, thus resulting in a variety of artifacts due to the various physiological motions of the body.

A second general method of acquiring and processing NMR imaging data is described in a paper by E. R. Andrew entitled "Nuclear Magnetic Resonance Imaging: The Multiple Sensitive Point Method" pp. 1232 to 1238 of the same issue. In this method, a selective system is used which acquires data from individual voxels in the volume of interest. This is accomplished using dynamically varying fields for the gradients. In general, with these dynamic fields, all but the small region not containing the time-varying field integrates to zero. Thus, if time varying fields of different frequencies are applied to three orthogonal axes, only a single point or voxel will not be time-varying. The signal will therefore represent solely that point without requiring reconstruction from projections.

The difficulty with this system is that it requires a very long data acquisition time since the signal is taken from one voxel at a time. Sufficient time must be spent at each voxel to provide an adequate signal to noise ratio. This problem is alleviated by using dynamic gradients on two axes and a static gradient on the third axis. Thus, in the direction of the third axis, each position again corresponds to a different frequency. Using wideband excitation and Fourier transforming the received signal the frequency spectra simultaneously provide the density of an array of voxels along a line. The line is that corresponding to the intersection of the two orthogonal dynamic gradients where all but a single line averages to zero.

Although this method avoids the motion artifacts caused by reconstruction from projections, it continues to provide a relatively long data acquisition time with the resulting blurring from physiological motions including respiratory and cardiovascular. In addition it is a three-dimensional imaging system which, as has been described, is generally unsuitable for vessel imaging.

A third imaging method is also line or point selective and is described in a paper by L. E. Crooks entitled, "Selective Irradiation Line Scan Techniques for NMR Imaging" pp. 1239-1244 of the same issue. This general approach has a number of variations. In one, a selective pulse is used to excite a single plane of interest using a static gradient and an appropriately shaped pulse. The resulting signal from the excited plane is stored. Following equilibrium an orthogonal plane is excited with a higher intensity such that the magnetization is inverted or made negative. Irradiation of this type produces no received signal. The first step is then repeated by selectively exciting the plane of interest and storing the resultant signal. In this case, however, a line in the plane of interest will be missing since it has been saturated by the high intensity excitation of a plane orthogonal to the plane of interest. Thus the line of intersection is not included in the resultant signal. A simple subtraction of the first and second stored signals represents the line of intersection. By measuring different lines at many angles and positions in the plane of interest, using this subtraction procedure, a reconstructed image of the plane is made using classical reconstruction from projection techniques.

An alternative approach using the same line intersection of orthogonal planes avoids the subtraction operation. In this case the orthogonal plane is immediately excited with inverting radiation. The line of intersection is affected so as to produce a spin echo signal at a later time. Thus, at this later time, the signal represents the desired line only. Again, an array of line integral signals are used to provide a cross-sectional image.

Similar sensitive point and sensitive line methods have been suggested which results in saturation of all but a specific plane of interest. This is immediately followed by a similar excitation in an orthogonal direction which saturates everything in the plane except a line. Either the line integral signal can be acquired, or a third orthogonal excitation can be used to acquire the signal from a point or voxel. Saturation is achieved by a relatively long "burn" radio frequency pulse, in the presence of a gradient, which demagnetizes the region corresponding to the frequencies excited. This procedure is described in a paper by A. N. Garroway, P. K. Grannell and P. Mansfield, "Image Formation in NMR by a Selective Irradiative Process," which appeared in *J. Phys. C: Solid State Physics,* Vol. 7, 1974, pp. L457–L462.

An additional approach to NMR imaging is described in a recent book entitled *Nuclear Magnetic Resonance Imaging in Medicine,* published in 1981 by Igaku-Shoin, Ltd., Tokyo. Chapter 3 of this book, by Lawrence E. Crooks, provides an overview of the various imaging techniques. In addition to those already mentioned there is another planar integration approach described on pp. 44–47. Here, each plane integral is phase encoded by applying a gradient normal to the plane. When the gradient is removed, the nuclei along the plane have cyclical phase distributions, depending on the strength of the magnetic field. By acquiring these planar integrals using phase distributions with different spatial frequencies, information is acquired about each line in the plane. This information is decoded again using Fourier transforms. This approach has been termed spin warp imaging.

Another approach has recently been reported on, which also provides cyclical distributions along a plane. In this case, however, the cyclical variations are achieved by imposing a gradient on the intensity of the r.f. excitation field. If the gradient is made strong enough, cyclical variations will occur across the plane where the regions of 90° excitation will provide a maximum response and those of 0° and 180° will have no response. As before, a series of excitations with gradients of varying intensities provides cyclical variations at different spatial frequencies which can be transformed to reconstruct the distribution within the selected plane. This process is described in a paper by D. I. Hoult entitled, "Rotating Frame Zeugmatography," which appeared in *Phil. Trans. R. Soc. London,* B289:543–547 (1980).

All of the NMR imaging systems that have been reported on are unsuitable for vessel imaging for a number of previously indicated reasons. Firstly, all but the first technique have been used to provide three-dimensional cross-sectional images which are unsuitable for vessel imaging. The vessel will wind through many planes, such that each cross section is of limited value. Projection imaging, as presently practiced in x-ray angiography, has been clearly shown to be the preferred modality for diagnosing narrowing or stenosis in vessels. In the one case where projection NMR imaging has been considered, as in the system of the first paper cited, the intervening tissue would seriously reduce the effectiveness of the image. In addition, these images require very long data acquisition times and produce severe artifacts due to object motion.

A paper on flow measurement written by J. R. Singer entitled, "Blood Flow Measurements by NMR of the Intact Body," appeared on pp. 1245–1249 of the previously mentioned *IEEE Transactions on Nuclear Science.* In this paper the concept of phase shift of the spin echo being proportional to average velocity is presented. Singer proposes to use both phase sensitive and envelope detection to map the proton density and flow of an entire volume using three-dimensional imaging techniques. The resultant cross-sectional images would show both density and flow. As before, the principle difficulty with these images are the very long data acquisition time, with its associated distortions, and the relative inability to diagnose vessel disease with cross-sectional images.

SUMMARY OF THE INVENTION

An object of this invention is to provide an NMR projection image of vessels within the body.

A further object of this invention is to provide isolated NMR projection images of vessels of the body with substantially reduced data acquisition time.

A further object of this invention is to provide NMR images of vessels with reduced sensitivity to image artifacts.

A further object of this invention is to provide NMR projection images of moving material.

Briefly, in accordance with the invention, a two-dimensional projection image is created of the magnetic spins in a volume. Those magnetic spins due to static materials are cancelled. The magnetic spin signals due to moving materials remain forming a two-dimensional projection image of the blood vessels in the body.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIG. 4 consists of graphs of waveforms of an excitation signal and the associated received signal;

FIG. 5 consists of graphs of waveforms using an alternate embodiment;

DESCRIPTION OF THE PREFERRED EMBODIMENT

Figure 1:
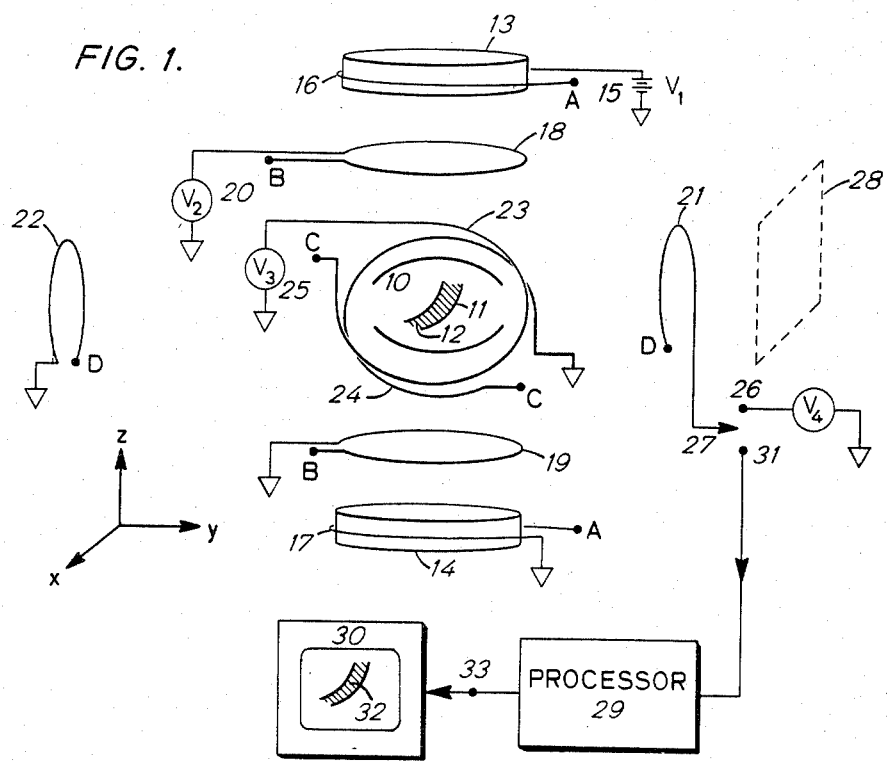
FIG. 1 is a schematic drawing illustrating an embodiment of the invention.

An understanding of the broad aspects of the invention may best be had by reference to FIG. 1. Here it is desired to provide an image of blood vessel 11 in a particular volume 10 of the human anatomy. Vessel disease is by far the most prevalent cause of death in humans. What is greatly desired is a noninvasive method of visualizing the vessels so as to provide mass screening of the general population. A process of this type requires the production of projection images of the vessels. This is in sharp contrast to existing x-ray computerized tomography or NMR cross-sectional images. These slices are of little value in evaluating narrowing in vessels since it requires a large array of them to follow a vessel. Clearly, the cross-sectional format is of little value in providing screening images for vessel disease. Also, NMR cross-sectional images are particularly sensitive to artifacts caused by non-uniform magnetic fields.

Therefore, in this invention, projection images of the vessel are created. For example, a two-dimensional projection image is made of volume 10 containing vessel 11. This projection can be represented by plane 28 in an xz plane.

A pure projection image would fail to visualize vessel 11 due to all of the intervening anatomical structures. In x-ray studies the vessels are isolated by injecting a contrast material. In this invention, using NMR imaging, an isolated projection image is made of vessel 11 by making use of the flowing motion of blood 12 through the vessel. Processor 29, in conjunction with r.f. excitation signal 26, operates to cancel the spin signals produced by the relatively static material in volume 10 and thus provide a signal solely due to vessel 11. In this way, the desired projection image is created in a totally noninvasive manner without any injection of contrast agents or use of ionizing radiation.

The description of the specifics of the NMR projection imaging will follow the description of the cancellation of the static material in volume 10. In general, however, the principal axial magnetic field is produced using, for example, pole pieces 13 and 14 excited by coils 16 and 17. These are driven by a d.c. source $V_1$ with the coils 16 and 17 producing fields in the same direction to create a substantially uniform field throughout the region of interest in volume 10. This is by far the strongest field in the system with a strength of the order of one kilogauss. With both this coil and the remaining coils, the letter pairs A-D are simply convenient ways of indicating connections.

Specific regions are selected using the gradient coils. Coils 18 and 19 form a gradient field in the z direction driven by 20, source $V_2$. Similarly coils 23 and 24 are on opposite sides of object 10 and thus form a gradient field in the x direction driven by 25, source $V_3$. Unlike coils 16 and 17 which create a uniform field, these gradient coils are bucking each other so as to produce a varying field in the respective direction.

Coils 21 and 22 are the radio frequency coils serving both the transmitter and receiver function. They produce fields in the same direction to create a substantially uniform field in volume 10. When switch 27 is in the transmit position 26, generator $V_4$, is used to excite the magnetic spins in volume 10. When switch 27 is connected to the receive position, signal 31 is received from magnetic spin signals in volume 10. These are processed in processor 29 to provide a projection image of the moving blood 12 in vessel 11. The resultant projection image 32 is displayed in display 30.

Figure 2A:
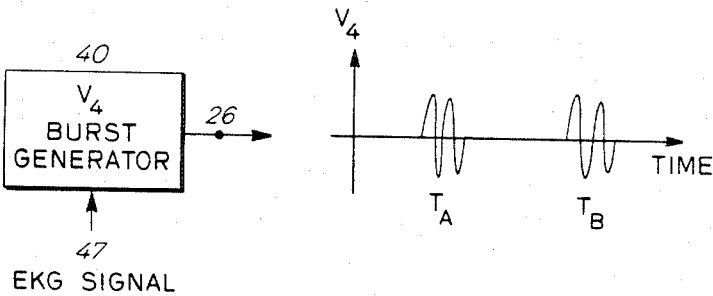
FIGS. 2a and 2b are portions of a block diagram of an embodiment of the invention involving subtraction of image information derived at different times.
Figure 2B:
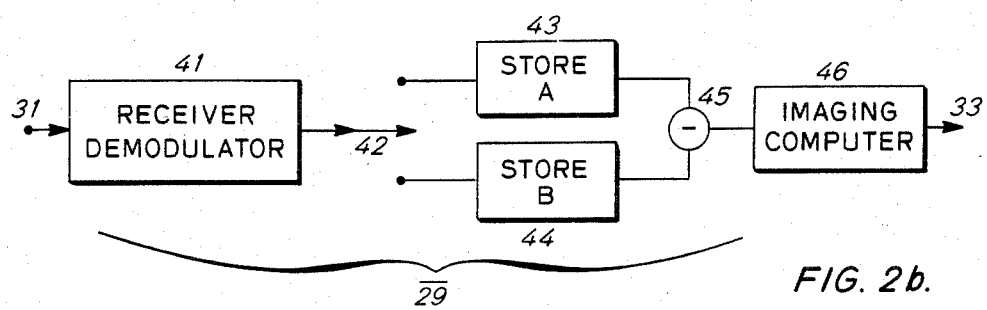

Excitation signal 26, and processor 29 combine to cancel or eliminate any magnetic spin signals due to structures in object 10 which are substantially static. One method of eliminating the signals due to the magnetic spins of static materials is illustrated in FIGS. 2a and 2b. Here the magnetic spins are excited, and signals are received at two different time intervals $T_A$ and $T_B$. These correspond to time intervals where the blood velocity is different. The usual r.f. excitation signal 26, $V_4$, is supplied by burst generator 40. The specifics of the pulse shape depend on the particular imaging arrangement used. In any case two bursts are generated at the two time intervals.

Moving blood, or other material, can result in a decrease in the received NMR signal since the excited spins move out of the sensitive region before they result in received signals. Thus a high velocity region will produce a smaller signal than a low velocity region. By timing the excitation signal $V_4$ with the EKG of the patient under study, received signals 31 can be collected representing times of relatively high and low velocity of blood 12 in vessel 11. The received signals 31 are demodulated using demodulator 41 and applied to switch 42 which is also activated at $T_A$ and $T_B$ by the EKG signal. Thus the signal from excitation $T_A$ is stored in 43, store A, and the signal from excitation $T_B$ is stored in 44, store B. These are subtracted in subtractor 45 to provide the desired signal representing vessels only and cancelling all static material. The subtracted signal is applied to imaging computer 46 which, as will subsequently be described, reconstructs a two-dimensional projection image.

Signals due to any substantially static material will be cancelled since the component signals will be the same at $T_A$ and $T_B$. The signals from vessel 11, however, will be different since they are taken with the blood 12 at different velocities.

Although FIGS. 2a and 2b illustrate a specific embodiment, this same principle can be applied in many ways. For example, a sequence of pulses 26 can be produced all representing the time $T_A$ in the heart cycle. This sequence of pulses may be required to generate a complete projection image corresponding to the $T_A$ time interval. This is followed by a sequence at $T_B$ in the heart cycle. The subtraction operation can then involve the complete image information rather than apply the subtraction at each heart cycle. In any case, it is desirable for the vessel to be at a similar position in $T_A$ and $T_B$ to avoid any loss of information.

Figure 3A:
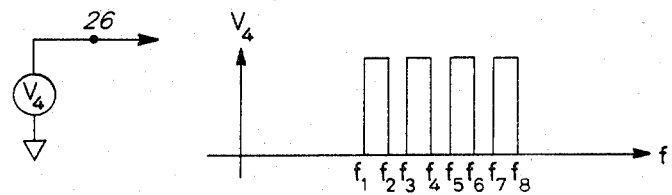
FIGS. 3a and 3b are portions of a block diagram of an embodiment of the invention involving excitation and reception from adjoining spatial distributions.
Figure 3B:
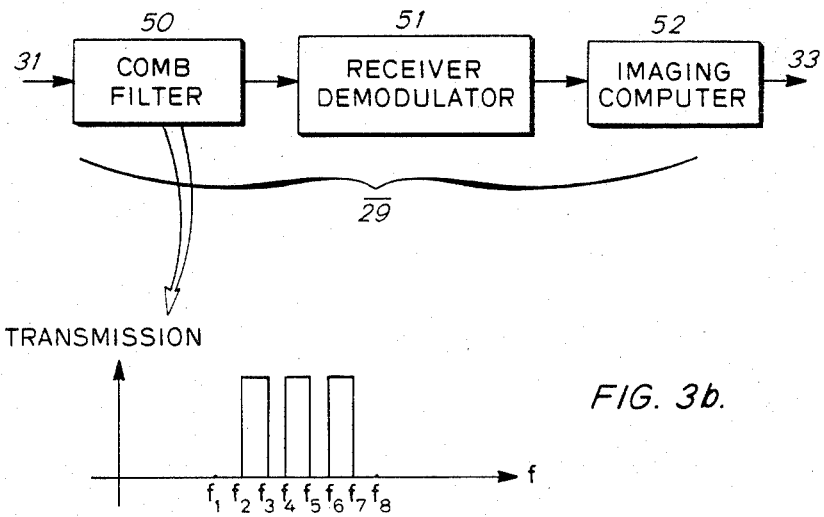

The method illustrated in FIGS. 2a and 2b can involve relatively long data acquisition times since the heart rate is approximately one beat per second. Depending on the imaging system used, this can cause distortion due to breathing motions. FIGS. 3a and 3b illustrate a system which does not depend on making two measurements during a heart cycle. When a particular sub-region of volume 10 is excited, static materials remain in that sub-region. Moving materials such as blood, however, carry excited atoms into adjacent regions. If the receiver is tuned to select only the adjacent regions, it will receive signals only due to moving blood, and those due to static materials will not be received or will effectively be cancelled.

As a simple illustration, using FIG. 1 assume a linear gradient field is applied in the z direction by applying a d.c. source as $V_2$. Under this condition, each xy plane along the z axis will correspond to a different resonant frequency. If we transmit a sinusoidal burst of a particular frequency as $V_4$, it will excite a particular xy plane. In the receive mode, with switch 27 connected to R, we adjust processor 29 so as to receive signals from adjacent planes and not from the excited plane. Processor 29 can consist of narrow band filters at frequencies above or below the burst frequency, or of both. Thus the output 33 will correspond solely to signals from moving blood which has flowed into the adjacent planes. The signals from static material will be at the original burst frequency and thus be cancelled.

FIG. 3 illustrates a more practical approach where an array of planes or an array of lines in a plane are imaged simultaneously. In many imaging approaches, as will be subsequently shown, Fourier transform techniques can be used to simultaneously receive signals from many regions since each produces a different frequency. In FIG. 3a generator $V_4$ produces excitation signal 26. FIG. 3a shows the spectrum of the signal as consisting of an array of spectral regions. As shown for illustrative purposes, spectral information exists from $f_1$ to $f_2$, $f_3$ to $f_4$, $f_5$ to $f_6$, and $f_7$ to $f_8$. The signal contains essentially no spectral energy, however, from $f_2$ to $f_3$, $f_4$ to $f_5$, and $f_6$ to $f_7$. This excitation signal in the time domain is characterized mathematically as $$V_4(t) = F^{-1}\{V_4(f)\} = F^{-1}\left\{\left[rect\left(\frac{f+a}{A}\right) + rect\left(\frac{f+a}{A}\right)\right] \sum_{n=-\infty}^{\infty} rect\left(\frac{f-nb}{B}\right)\right\}$$

$$= (\text{sinc } At \cos at)\text{sinc } Bt \sum_{n=-\infty}^{\infty} \cos 2\pi nbt$$

where $$rect\ x = \begin{cases} 1 \text{ for } |x| > \frac{1}{2} \\ 0 \text{ otherwise} \end{cases}$$

$F^{-1}$ is the inverse transform operator, and sinc $x = (\sin \pi x)/(\pi x)$.

This signal provides a two sided frequency domain where each side has a rectangular width A containing an array of small rectangular sections of width B, separated by b. The center frequency of the array of rectangles is given by "a". Therefore the signal $V_4(t)$ will provide the desired spectrum to create the array of separated regions of excitation.

In operation, with switch 27 in the transmit position, the previously described signal; $V_4$, becomes signal 26.

This represents the excitation of alternate regions; either alternate planar sections of a volume, or alternate line sections of a planar section. In static regions these excited nuclei will remain in their relative excited positions. In regions with moving material, such as moving blood 11 through vessel 12, the excited nuclei move into the adjacent, unexcited regions. Switch 27 is then thrown into the receive position providing received signal 31 to processor 29. As shown in FIG. 3a, processor 29 includes comb filter 50 which transmits signals only in the unexcited spectra; that is a spectra interleaved with the excitation spectra of signal $V_4$. These signals can therefore only be from nuclei from moving material which have travelled to adjacent regions. These signals are demodulated by 51 and sent to imaging computer 52 to provide signal 33 representing a projection image of volume 10 containing vessel 11. All static structures in volume 10 are thereby cancelled and do not appear in signal 33 since the signals produced by these static nuclei are stopped by filter 50. The different types of imaging computer 52 will be subsequently considered.

FIG. 4 illustrates another method of cancelling the signals from the nuclei of static material. The transmit signal $V_4$ is given the required intensity and duration to invert the magnetic spins, thus producing no free induction decay signal following the excitation. The dashed line illustrates the linear rise in the angle of the magnetic movement, terminating at 180°. Moving material, however, will not experience the complete inversion signal. Fresh nuclei, such as the blood 11 in vessel 12, will receive a partial excitation, less than 180°. The 90° component of these moving nuclei will provide the free induction decay signal 31 shown in FIG. 4 due to moving material only. Thus the signals from static nuclei are effectively cancelled since they experience an inverting excitation.

The duration of inverting signal $V_4$ can be adjusted to comply with the anticipated velocity of blood in the vessel of interest. Signal $V_4$ can be sinusoidal for excitation of a specific plane or line. More often, however, signal $V_4$ will be a pulse having a broad spectrum to simultaneously excite a number of planes in a volume or a number of lines in a plane.

FIG. 5 illustrates a similar approach to the cancellation of static material. Here $V_4$ consists of two bursts which each provide 90° excitation, as shown in the dashed line. The time between the bursts is longer than $T_2$, the spin-spin relaxation time in the presence of various gradients, and less than $T_1$, the longitudinal relaxation time. Following the first burst a classical free induction decay signal is generated illustrated by the dashed line. Switch 27, however, remains in the transmit position so that this signal is not received. This signal could be utilized, however, if it was desired to display the static anatomy of volume 10 in addition to that of the vessel 11. A color display could be used whereby the static anatomy and the vessel images are displayed simultaneously.

To provide the desired vessel image, with the static material cancelled, switch 27 is connected to the receive position following the second burst of signal $V_4$. Since the nuclei from the static material are inverted by the second burst, only fresh nuclei from moving material will produce the free induction decay signal shown by the solid line in FIG. 5. This signal 33 is then used to provide a projection image of the vessel only. This is an illustration of a general theme where two bursts are used to cancel static material. An alternate method using a 90° burst followed by a 180° burst is described in a paper by W. J. Packer in the 1969 edition of *Molecular Physics*, Volume 17, pp. 355-368.

Figure 6:
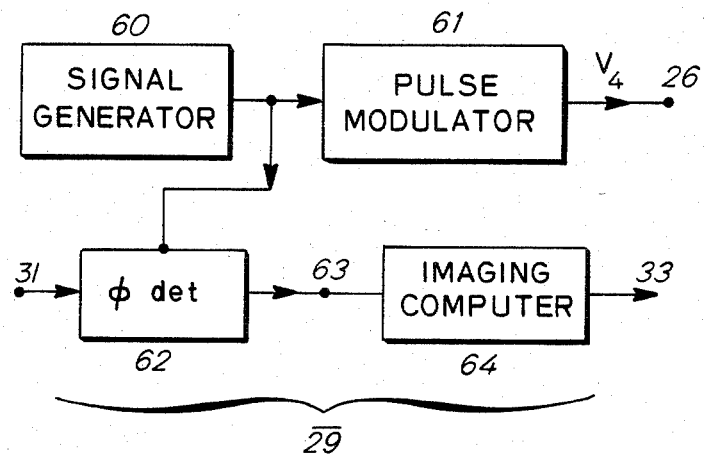
FIG. 6 is a block diagram of the processing system of an embodiment of the invention using phase variation.

As indicated in the previously referenced paper by J. R. Singer, moving materials, such as blood, produce phase shifts in the resultant NMR signals. This property can be used to provide projection images of vessels, with the stationary regions cancelled. As shown in FIG. 6, $V_4$, the transmitted burst signal 26, can be derived using a signal generator 60 and a pulse modulator 61. This same signal generator 60 then serves as a phase reference for the received signal 31. Phase sensitive detector 62 can be a synchronous detector whose phase is adjusted to be in quadrature with the signals derived from static material. Thus these signals will be cancelled in phase detector 62 and not appear in the output signal 63 coupled to imaging computer 64. Depending on the particular projection imaging system used, signal 60 can be a sinusoidal signal representing a single line or plane, or a wideband signal representing an array of lines or planes which are decomposed by Fourier transformation in Imaging Computer 64.

In some cases where relatively high frequency NMR signals are used through relatively thick body regions, the signals from static regions of themselves experience some phase shift when travelling through the tissue to radio frequency pick-up coils 21 and 22. This incidental phase shift can cause errors in the system of FIG. 6. These errors can be compensated for by the system of FIG. 7. Here data is acquired at two different frequencies by changing the axial field strength. This is accomplished by changing the current through coils 16 and 17. As shown switch 73 is switched between $V_1$ and a different voltage $V'_1$. Thus source 15 changes, changing the current through coils 16 and 17. Since this changes the fundamental frequency of the system, the frequency of signal generator 60 must be changed accordingly.

The undesired incidental phase shift is a function of frequency. Therefore, the amount of phase shift change is an indication of the phase shift due to the static material. The phase shifts at the two states are stored in storage structures 70 and 71 using switch 74. Using compensator 72, the signals due to static materials can be cancelled, using the phase shift change due to static materials. This leaves solely the desired signal 75, representing moving material only, which is passed on to the imaging computer 64.

A number of embodiments have been described for acquiring NMR signals where the signals due to static structures have been cancelled, leaving only those caused by moving materials, such as blood in vessels. As has been indicated, it is most desirable to view projection images of these vessels for a number of reasons. A projection image shows the entire vessel in its path through the volume, rather than a cross-sectional slice. Also, projection imaging can be accomplished in less time, at higher resolution and with improved signal to noise ratio. In addition, these images are much less sensitive to artifacts than 3D reconstructions and can thus tolerate greater non-uniformity in magnetic fields.

Projection images can be accomplished in a variety of ways, using the basic structure of FIG. 1. In one approach an array of planar integrals are formed, each being perpendicular to the projection plane 28. At each angle, the signals from a set of parallel planes are acquired. The angle of the planes are determined by the direction of the gradient field. The total gradient field is a combination of the gradient field in the z direction, driven by signal $V_2$ using coils 18 and 19, and the field in the x direction, driven by signal $V_3$ using coils 23 and 24.

For example, if a voltage is applied to $V_2$, with $V_3$ zero, the gradient field will be solely in the z direction. Therefore each xy plane, perpendicular to the z axis, will experience a different magnetic field and produce a different frequency. When the volume is excited by a broadband r.f. signal $V_4$, these parallel planes will simultaneously provide signals 31. Processor 29 then includes a Fourier transform system, such as a digital FFT (Fast Fourier Transform), to separately extract the signals from each of the parallel planes. This process is repeated with a voltage applied to $V_3$, with $V_2$ zero, providing information about a parallel set of yz planes, each perpendicular to the x-axis. Sets of planes at intermediate angles are acquired by simply using voltage combinations on $V_2$ and $V_3$ to provide gradients at intermediate angles.

All of these planes, at all angles, will be perpendicular to projection plane 28. The integrated activity of each plane is a line projection onto plane 28. The desired projection image is then reconstructed in processor 29 using classic reconstruction from projection techniques. The most common is the convolution back projection system. Thus processor 29 consists of a Fourier transform system to provide the planar signals at all angles, a storage system to store the values at each angle, and a reconstructor to reconstruct the two-dimensional projection image.

One problem with the previous projection imaging system is that all of the planar data must be collected before the image can be reconstructed. This can make the system somewhat sensitive to motion. A preferred embodiment involves the same basic structure in FIG. 1. Here the information for a complete line in projection image 28, representing the lines in a plane in volume 10, can be acquired. The gradient field in the z direction is made time-varying by making $V_2$ an a.c. or time-varying signal. One xy plane, perpendicular to the z axis, will not be time-varying since it will be at the null of the gradient field. Received signal 31 will receive NMR signals from that null plane since the others will not receive the correct excitation. The time-varying gradient can be applied in the transmit and/or the receive mode to average out all but the null plane.

A static gradient is applied in the x direction by applying a constant voltage $V_3$ to coils 23 and 24. Therefore each line in the null plane will produce a different frequency, if excited by burst generator $V_4$. Processor 29 includes a Fourier transform system for taking a transform of the signals from the null plane. Decomposing the signal into different frequencies provides the signals from each line in the plane, or each point in the line on projection plane 28. Thus the output of the Fourier transform system directly provides an array of points along a line in the projection image.

This process is repeated, changing the z position of the null plane. The null plane is determined by that plane where the gradient field induced by a.c. signal $V_2$ is zero. As shown in FIG. 1, with the B terminal on coil 18 connected to the B terminal on coil 19, the null plane will be exactly between the coils since they are driven out of phase. To move the position of the null plane we can ground the upper B terminal on coil 18, and connect a signal $kV_2$ to the lower B terminal on coil 19. With k equal to unity, the null plane will again be between the coils. However, by making k greater than or less than unity, the null plane will move higher and lower respectively. Thus any desired plane can be selected to provide the desired horizontal line image on projection plane 28.

Motion consideration are considerably improved with this data acquisition system. Since the projection image is acquired a line at a time, blurring considerations are based on the acquisition time of each line, rather than the time of the entire image. This approach is therefore preferable in regions of the body, such as the heart, where rapid motions are involved.

The two projection imaging systems just described can be used with any of the previously described systems for cancelling static material such as to visualize moving blood. In each case the excitation and receiver systems are replaced by those shown in FIGS. 2 through 7.

An alternate data acquisition system makes use of the inversion property of NMR. An inversion excitation of 180° inverts the angle of the magnetic spin moment and produces no free induction decayy signal. A specific plane, normal to the projection plane 28, can be excited. This plane can then be decomposed into individual lines using the intersection with an array of orthogonal planes, each provided with inversion excitation.

As an example, we use a gradient field in the z direction by applying a voltage $V_2$. As before each xy plane at different z values experiences a different magnetic field and thus represents a different frequency. A particular xy plane can be excited by applying a burst $V_4$ of the appropriate frequency with switch 27 in the transmit position. The amplitude and duration of this burst is adjusted to provide the classical 90° rotation of the magnetic moment. The resultant free induction decay signal is ignored.

We next decompose the selected plane into an array of individual lines perpendicular to the projection plane 28. This forms a line of the desired projection image. The array of lines are formed by an array of yz planes intersecting the saturated xy planes. This array of planes are formed by first applying a voltage $V_3$ to provide a gradient in the x direction so that each yz plane corresponds to a different resonant frequencies. A broadband inverting excitation is then applied using $V_4$. This inerting or 180° excitation will only produce an output at the intersection with the excited xy plane.

The resultant free induction decay signal 31 is a broadband signal representing the array of intersection lines in the excited xy plane. Processor 29 includes a Fourier transform system for decomposing the signal into its frequency components representing each of the lines of intersection. Each of these lines represents the projection value of a point on projection plane 28. This sequence is repeated for each xy plane by merely changing the frequency of the burst signal $V_4$ when the plane is selected. Thus the complete projection image is formed.

Figure 7:
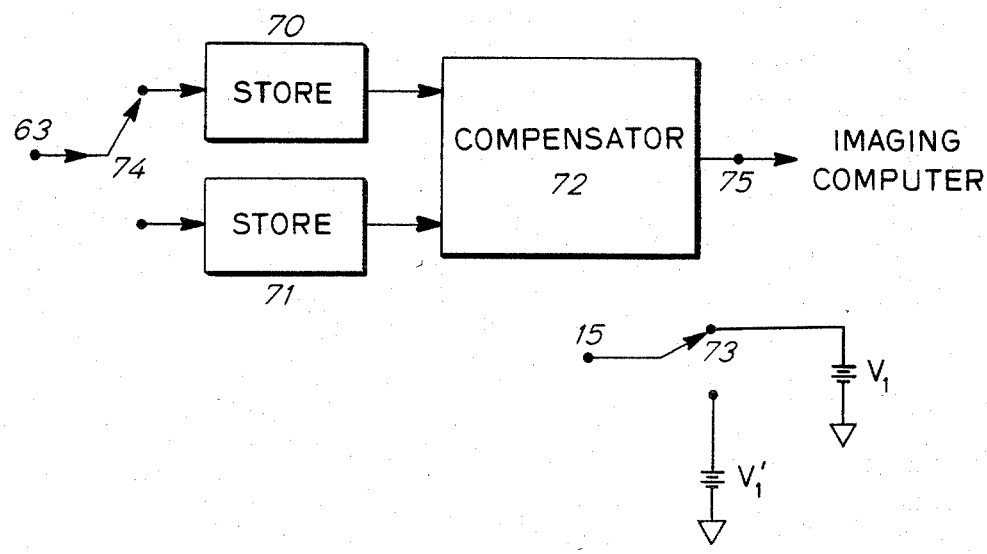
FIG. 7 is a block diagram of a compensation system for the embodiment using phase variations.

Here again, this projection imaging system can be used with each of the previously described systems for cancelling static material and imaging moving material. For the system of FIG. 2, the two pulse sequence is repeated at times $T_A$ and $T_B$. For the system of FIG. 3, the 180° inverting signal is replaced by the inverting excitation signal having the spectrum shown in FIG. 3A, using the signal processing described in FIG. 3B. For the systems of FIGS. 4 and 5, the 90° plane selection signal is replaced by the $V_4$ excitation signals shown. The system described in FIGS. 6 and 7 is used as shown.

A similar projection imaging system can be used based on a paper by P. Mansfield, A. A. Maudsley and T. Baines entitled, "Fast Scan Proton Density Imaging by NMR," which appeared in the *Journal of Physics E: Scientific Instruments,* 1976, Vol. 9, pp. 271–278. In this method, using a gradient in the z direction, a shaped pulse is used which excites all planes but one section with a 90° spin moment. Then, using a gradient normal to the unexcited plane, another 90° excitation is used. Only the intersection of the two planes produces a received signal following the second excitation.

Referring to FIG. 1, using a gradient field derived from $V_2$, a pulse excitation $V_4$ is used of the form $$V_4 = F^{-1}\left[\frac{rect(f - f_0)}{a} + \frac{rect(f + f_0)}{a} - \frac{rect(f - f_0)}{b} - \frac{rect(f - f_0)}{b}\right]$$

$$= [a \text{ sinc } at - b \text{ sinc } bt]\cos 2\pi f_0 t,$$

where $f_0$ is the center frequency representing the plane being addressed, b represents the thickness of the desired section and a represents the thickness of the entire volume. Thus the excited field is the difference of the two rectangular functions, the large one representing the size of the volume a, and the small one the section thickness b. Following the excitation, a gradient normal to the xy plane is produced by applying a voltage $V_3$. With the gradient a broadband pulse $V_4$ is used which simultaneously excites all of the spin moments in the selected xy plane to the 90° level. The resultant free induction decay signal is Fourier transformed to provide the projection of the lines in the selected plane only. This sequence is then repeated with a new gradient in the z direction to select a new plane. Again this can be used with each of the static material cancellation systems described. For the systems of FIGS. 3-5, the signal $V_4$ replaces the broadband 90° r.f. pulse.

The final projection imaging method is based on the spin warp imaging method previously described. This is similar to the previous method in that an excited xy plane is decomposed into individual lines. The method of decomposition, however, is distinctly different. Prior to exciting the selected xy plane with burst signal $V_4$, a gradient normal to the plane is applied using voltage $V_3$. This has the affect of periodically "warping" the phase along the x direction. The resultant received signal therefore represents periodic variations in the x direction within the excited xy plane. The spatial frequency of these periodic variations can be altered by changing the strength of the gradient, as represented by voltage $V_3$. By taking a sequence of measurements, each with a different voltage $V_3$, the distribution in the x direction becomes decomposed into its spatial frequency components. Processor 29 can include an inverse Fourier transform to convert this spatial frequency decomposition into the desired line components perpendicular to the projection image 28.

As described, this system, through a sequence of excitations, resulted in the decomposition of the excited plane into lines. As before, this can be repeated for all xy planes. This, however, would represent a relatively long data acquisition time. A preferred approach is the use of a broadband excitation signal $V_4$ which simultaneously excites all of the parallel xy planes. Again, these are each of different frequencies because of the gradient in the z direction introduced by $V_2$. The phase warping gradient in the x direction, produced by $V_3$, will now be simultaneously applied to all xy planes at their individual frequencies. The individual planes are separated in processor 29 using the previously described Fourier transform system to separate the individual frequencies corresponding to each plane. Thus a temporal Fourier transform separates the individual xy planes and a spatial inverse Fourier transform decomposes the lines in the planes.

This projection image, as before, can be used with any of the arrangements for cancelling static material. For the system of FIG. 2, the entire sequence is repeated at $T_A$ and $T_B$. For the system of FIGS. 3-5, the excitation signal $V_4$ is used as shown.

A number of other data acquisition systems, described in the literature, can be used if modified for the projection mode. Again, each projection system is used with one of the static material cancellation arrangements previously described.

Each of the basic data acquisition systems described have been used as parts of complex data acquisition systems to provide three-dimensional cross-sectional images. In this invention, however, these data acquisition systems have been modified to provide two-dimensional projection images of the volume 10 with all of the aforementioned advantages of faster data acquisition, better SNR, higher resolution, less sensitivity to artifacts, relaxed requirements on the uniformity of the magnetic fields and a much larger and more appropriate field of view.

The major purpose of the invention is to provide a noninvasive method of imaging the moving blood in vessels. In many cases the intensity of the resultant signal will represent the velocity of the moving blood so that this additional parameter can be used to aid in the diagnosis.

As described, the image of the blood vessels were obtained at a specific projection angle in the y direction onto plane 28. In many diagnostic studies it is desired to obtain projection images at more than one angle. This can be accomplished by rotating the entire structure in FIG. 1. Alternatively, an additional set of coils can be used perpendicular to coils 23 and 24 and parallel to projection plane 28. These can be used, in lieu of coils 23 and 24, to provide a projection image in an orthogonal plane.

In some cases the projection image can include undesired vessels or other structures, such as heart chambers, which contain moving blood. The effects of these can be minimized by not including them in the excited magnetic volume. This can be accomplished by restricting either the static field produced by coils 16 and 17, or preferably the r.f. excitation field produced by coils 21 and 22, to the region of interest. The size and placement of these coils, of themselves, will restrict the portion of the volume having magnetic spin activity.

In some cases more elaborate and more exacting methods will be desired for obtaining projection images over specific regions of volume 10. This can be done using two general methods. These methods have been previously described in the literature as parts of three-dimensional imaging systems. Here, we use these techniques in unique ways to limit the volume over which the projection images are taken.

One general approach is related to a paper by D. Hoult entitled, "Rotating Frame Zeugmatography," which appeared in the *Phil. Trans. R. Soc. London,* B289, 1980, pp. 543-547. In this paper the concept is introduced of a gradient in the $B_1$ or radio frequency field. A gradient in the r.f. field means portions of the volume will undergo the desired 90° excitation while other portions will undergo a 180° inversion and produce no signal. In the paper this method is used, as with the spin warp system, to decompose a plane into a variety of cyclical spatial components. In this system, this can be used to restrict the volume of interest.

Coils 21 and 22, instead of being driven equally as in FIG. 1, can be driven to provide a gradient of excitation. Point D on coil 21 can be grounded, with point D on coil 22 driven by $kV_4$. The gradient in intensity will depend on k where k is greater than or less than unity, depending on the desired gradient direction. For example, the gradient can be arranged such that the undesired portion of the volume experiences the 180° inversion and produces no signal. Another arrangement is a gradient varying in phase from 0° on one end to 180° on the other. In this case the central region of the volume, having the required 90° excitation, will provide a projection image with the end regions producing no decay signal. More elaborate systems can be used employing sequences of excitation having coarse periodic variations. These can then be stored and combined and used to select any region of volume 10. It should be emphasized, however, that a relatively few such excitations are required as compared to systems employing three-dimensional imaging. This general volume selection system can be used with the static material cancellation systems of FIGS. 2, 3, 6 and 7. It is not recommended for the systems of FIGS. 4 and 5 where the cancellation depends on the angle of the magnetic moment.

A second general approach to selecting a portion of the volume involves the concept of saturation. This concept is described in a paper by A. N. Garroway, P. K. Grannell and P. Mansfield entitled, "Image Formation of NMR by a Selective Irradiation process," in *Journal Phys. C: Solid State Physics,* Vol. 7, 1974. Here the spin moments of specific regions are demagnetized by using a "burn" pulse; a 180° inversion pulse having a duration comparable to $T_1$, the spin-lattice relaxation time. The frequency content of this pulse determines the region being saturated. Therefore, $V_4$ can be a saturation pulse having a frequency content representing those regions of volume 10 where the projection image is not desired. The pulse contains no energy at those frequencies corresponding to the desired regions of volume 10.

Following the volume-selecting saturation pulse $V_4$, any projection imaging system can be used on the unsaturated volume. Again, the projection imaging system can be used with any of the static material cancellation systems.

In general, the techniques used in three-dimensional reconstructions can be used in a limited form to restrict the volume over which the two-dimensional projection is obtained.

As previously indicated, the systems described not only provide isolated images of blood vessels, but also provide signals representative of blood velocity. In some configurations a quantitative representation of blood velocity can be provided. Also, the velocity and nature of the flow can be studied by using various combinations of excitation systems. For example, the system of FIG. 3 can be used to determine the direction of blood flow by separately studying regions on either side of the excited regions.

What is claimed is:

1. In a method for imaging moving material in a volume the steps of:
   exciting the magnetic spins in the volume, receiving signals from the excited spins and processing the received signals so that static material will produce no net received signal and moving material will produce a signal; and
   further processing the received signals to form a two-dimensional projection image of the moving material in volume.

2. The method as described in claim 1 wherein the steps of exciting magnetic spins and receiving signals from the excited spins includes the steps of:
   exciting magnetic spins in a first sub-region of the volume; and
   receiving signals from a second sub-region of the volume adjacent to that of the first sub-region wherby only excited material which has moved from the first sub-region to the second sub-region will produce a received signal.

3. In a method for providing projection images of blood vessels in a volume of the body the steps of:
   addressing the magnetic spins in the volume so that all material other than the moving blood will produce no net received signal; and
   processing the resultant received signals to form a two-dimensional projection image of the moving blood in the blood vessels.

4. The method as described in claims 1, or 3 wherein the step of processing the received signals to form a two-dimensional projection image includes the steps of:
   exciting the magnetic spins in a first plane perpendicular to the projection image;
   exciting the magnetic spins in planes perpendicular to the first plane and perpendicular to the projection image whereby signals are received solely from the line intersections of the perpendicular planes; and
   repeating this sequence for a series of planes parallel to the first plane.

5. Apparatus for providing a two-dimensional projection image of moving material in a volume comprising:
   means for producing received signals which represent a two-dimensional projection image of the magnetic spin activity in the volume; and
   means for cancelling that portion of the received signals generated by static material.

6. Apparatus as recited in claim 5 wherein the means for cancelling that portion of the signal generated by static material includes:
   means for exciting the magnetic spins in a first set of sub-regions of the volume where the first set of sub-regions are distributed substantially uniformly throughout the volume and are separated from each other;
   means for receiving signals from a second set of sub-regions of the volume where the second set of sub-regions are distributed substantially uniformly throughout the volume and are interleaved with the first set of sub-regions and are in the separation regions of the first set of sub-regions whereby only excited material which has moved from the sub-region of the first set to the sub-region of the second set will produce a received signal.

7. Apparatus as recited in claim 6 wherein the first sub-region consists of a first array of parallel spaced planar sections and the second sub-region consists of a second array of parallel spaced planar sections interleaved with the first array.

8. Apparatus as recited in claim 6 wherein the first sub-region consists of a first array of parallel spaced line sections and the second sub-region consists of a second array of parallel spaced line sections interleaved with the first array.

9. Apparatus for providing projection images of blood vessels in a volume of the body comprising:
   means for producing received signals which represent a two-dimensional projection of the magnetic spin activity in the volume; and
   means for cancelling the received signals produced by static material in the volume whereby the remaining signals represent primarily moving blood in blood vessels.

10. Apparatus as recited in claims 5, and 9 wherein the means for producing received signals which represent a two-dimensional projection image of the volume includes:
    means for exciting the magnetic spins in a first plane perpendicular to the two-dimensional projection image;
    means for exciting the magnetic spins in planes perpendicular to the first plane and perpendicular to the projection image whereby signals are received soley from the line intersection of the perpendicular planes; and
    means for repeating the sequence for a series of planes parallel to the first plane.

11. Apparatus as recited in claims 5 and 9 including means for producing a second two-dimensional projection image where the static material has been removed and where the second projection image is taken at an angle different from that of the first projection.

12. Apparatus as recited in claims 5 and 9 including means for restricting the magnetic spin activity to a portion of the volume whereby undesired moving structures are not imaged.

13. Apparatus as recited in claim 12 wherein the means for restricting the activity to a portion of the volume includes means for restricting the region of the static magnetic field.

14. Apparatus as recited in claim 12 wherein the means for restricting the activity to a portion of the volume includes means for restricting the region of the radio frequency magnetic field.

15. Apparatus as recited in claim 12 wherein the means for restricting the activity to a portion of the volume includes means for exciting the magnetic spins in the volume which produce a gradient excitation field whose amplitude varies over the extent of the volume.

16. Apparatus as recited in claim 15 including means for exciting the magnetic spins in the volume with a sequence of excitations producing gradient excitation fields of different intensities and including means for combining the received signals from each of the sequence of excitations.

17. Apparatus as recited in claim 12 wherein the means for restricting the activity to a portion of the volume includes means for exciting portions of the volume with a saturation excitation to insensitize those portions.

18. Apparatus as recited in claims 5 and 9 including means for additionally displaying the static material in addition to the moving material.

19. Apparatus as recited in claim 18 wherein the moving material and the static material are displayed in different colors.

* * * * *